United States Patent
Iwata

(10) Patent No.: US 10,121,816 B2
(45) Date of Patent: Nov. 6, 2018

(54) IMAGING DEVICE AND METHOD OF MANUFACTURING IMAGING DEVICE

(71) Applicant: CANON KABUSHIKI KAISHA, Tokyo (JP)

(72) Inventor: Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/455,599

(22) Filed: Mar. 10, 2017

(65) Prior Publication Data
US 2017/0301719 A1 Oct. 19, 2017

(30) Foreign Application Priority Data
Apr. 18, 2016 (JP) .................................. 2016-082624

(51) Int. Cl.
*H01L 27/146* (2006.01)
*H04N 5/378* (2011.01)

(52) U.S. Cl.
CPC .. *H01L 27/14645* (2013.01); *H01L 27/14627* (2013.01); *H04N 5/378* (2013.01)

(58) Field of Classification Search
CPC ................ H01L 27/14616; H01L 27/14643
USPC .......................................................... 257/292
See application file for complete search history.

(56) References Cited

U.S. PATENT DOCUMENTS

| | | | |
|---|---|---|---|
| 8,476,102 B2 | 7/2013 | Takada | |
| 8,648,944 B2 | 2/2014 | Iwata | |
| 8,697,500 B2 | 4/2014 | Iwata | |
| 9,543,340 B2 | 1/2017 | Iwata | |
| 2011/0136291 A1 | 6/2011 | Iwata | |
| 2016/0150176 A1 | 5/2016 | Hiyama | |
| 2017/0301719 A1* | 10/2017 | Iwata | ................ H01L 27/14645 |

FOREIGN PATENT DOCUMENTS

JP 2011-171511 9/2011

* cited by examiner

*Primary Examiner* — Mark Prenty
(74) *Attorney, Agent, or Firm* — Fitzpatrick, Cella, Harper & Scinto

(57) ABSTRACT

An imaging device includes a plurality of pixels. Each of the pixels includes a photoelectric conversion unit provided in a first semiconductor region of a first conductivity type, a transfer transistor including a second semiconductor region of a second conductivity type to which charge generated in the photoelectric conversion unit is transferred, a third semiconductor region of the first conductivity type provided in a portion deeper than the second semiconductor region and having a higher impurity concentration than the first semiconductor region, and a counter doped region provided around the second semiconductor region. A part of the third semiconductor region and a part the counter doped region are overlapped with a gate electrode of the transfer transistor in a plan view. An overlap of the counter doped region with respect to the gate electrode is larger than an overlap of the third semiconductor region with respect to the gate electrode.

14 Claims, 12 Drawing Sheets

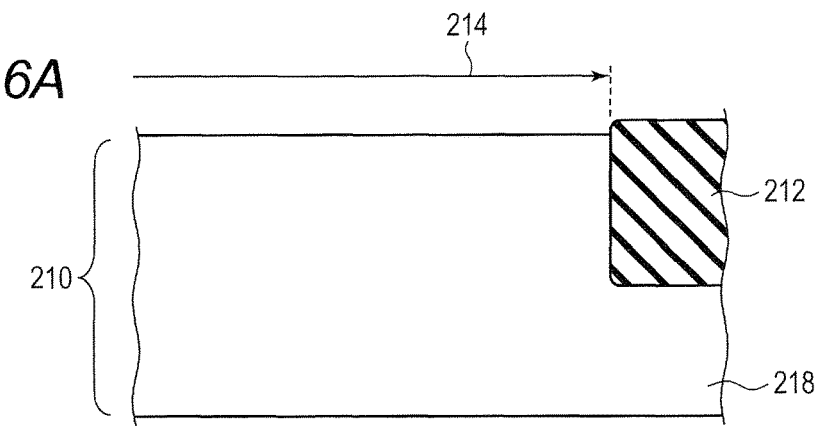
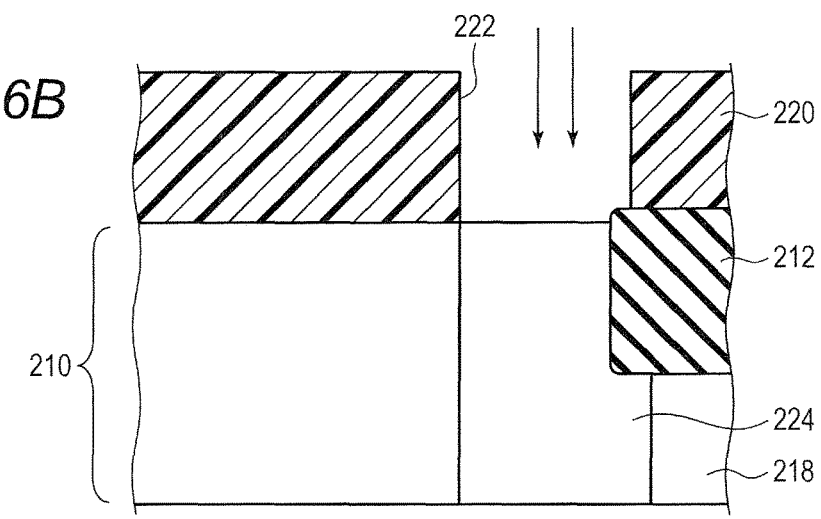
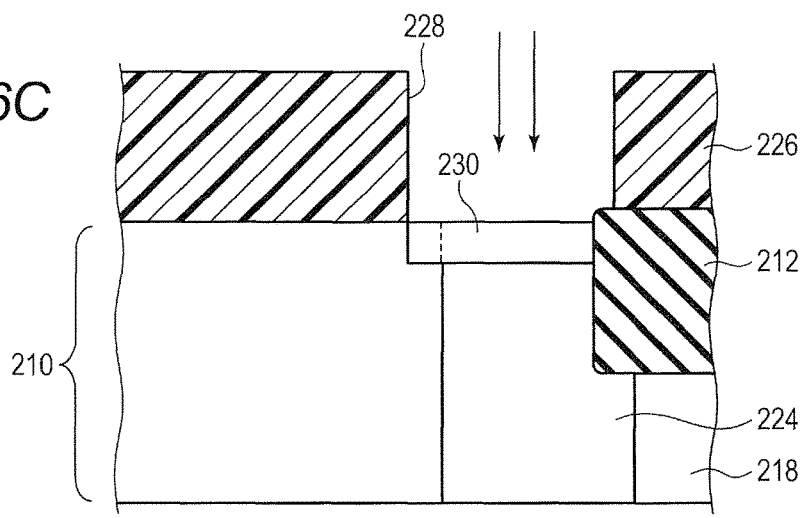

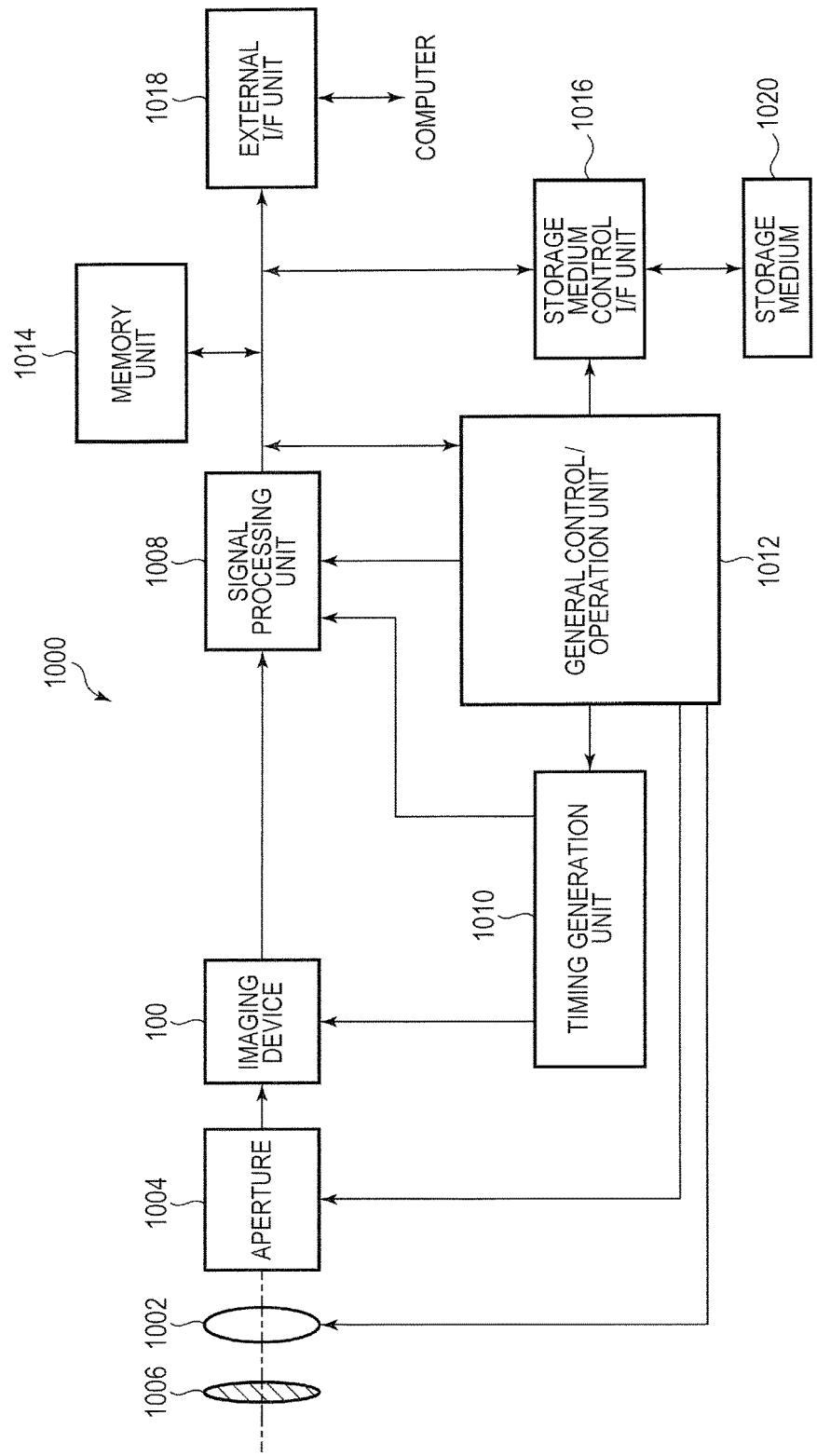

IMAGING DEVICE AND METHOD OF MANUFACTURING IMAGING DEVICE

BACKGROUND OF THE INVENTION

Field of the Invention

The present invention relates to an imaging device and a method of manufacturing the imaging device.

Description of the Related Art

An imaging device used for an imaging system exemplified by a digital still camera, as a development of a narrower pitch scheme of pixels for higher pixelization is underway, is thereby requested to reduce a concomitantly increased leakage of a signal charge into an adjacent pixel. Known as a technology of reducing the leakage of the signal charge into the adjacent pixel is a technique of forming a potential barrier against the signal charge by disposing, e.g., a semiconductor region having majority carriers of an opposite polarity to the signal charge between the pixels.

In relation to this technology, Japanese Patent Application Laid-Open No. 2011-171511 proposes a technology of performing counter doping in the vicinity of a surface of a substrate in order to prevent being affected by an impurity unintentionally implanted in the vicinity of the surface of the substrate when forming a semiconductor region formed with the potential barrier between the adjacent pixels by ion implantation.

It proves, however, that even when the counter doped region is formed by using the technology described in Japanese Patent Application Laid-Open No. 2011-171511, it is unfeasible to sufficiently compensate a carrier due to the impurity unintentionally implanted in the vicinity of the surface of the substrate on the occasion of forming the semiconductor regions becoming the potential barrier as the case may be. In particular, when such a region occurs under a gate electrode of a transfer transistor, it follows that the potential barrier occurs against the carriers migrating in a channel, resulting in an apprehension of causing a deterioration of transfer performance of the transfer transistor.

SUMMARY OF THE INVENTION

It is an object of the present invention to provide an imaging device and a manufacturing method thereof that are capable of restraining a leakage of a signal charge into an adjacent pixel without causing a deterioration of transfer performance of a transfer transistor.

According to one aspect of the present invention, there is provided an imaging device including a plurality of pixels disposed two-dimensionally, each of the plural pixels including a photoelectric conversion unit provided in a first semiconductor region of a first conductivity type, a transfer transistor including a second semiconductor region of a second conductivity type which is provided in the first semiconductor region and to which charge generated in the photoelectric conversion unit is transferred, a third semiconductor region of the first conductivity type provided in a portion deeper than the second semiconductor region and having an impurity concentration higher than an impurity concentration of the first semiconductor region, and a counter doped region provided around the second semiconductor region, wherein at least a part of the third semiconductor region and at least a part of the counter doped region are overlapped with a gate electrode of the transfer transistor in a plan view, and a first overlap of the counter doped region with respect to the gate electrode is larger than a second overlap of the third semiconductor region with respect to the gate electrode.

According to another aspect of the present invention, there is provided a method of manufacturing an imaging device including a plurality of pixels each including a photoelectric conversion unit provided in a first semiconductor region of a first conductivity type, and a transfer transistor including a second semiconductor region of a second conductivity type which is provided in the first semiconductor region and to which charge generated in the photoelectric conversion unit being transferred, the method including forming a third semiconductor region of the first conductivity type having an impurity concentration higher than an impurity concentration of the first semiconductor region in the first semiconductor region of a portion deeper than a region where the second semiconductor region is to be provided, forming a counter doped region in a surface portion of the first semiconductor region of the region where the second semiconductor region is to be provided, and forming a gate electrode of the transfer transistor, wherein at least a part of the third semiconductor region and at least a part of the counter doped region are overlapped with the gate electrode in a plan view, and a first overlap of the counter doped region with respect to the gate electrode is larger than a second overlap of the third semiconductor region with respect to the gate electrode.

Further features of the present invention will become apparent from the following description of exemplary embodiments with reference to the attached drawings.

BRIEF DESCRIPTION OF THE DRAWINGS

FIGS. 6A, 6B, 6C, 7A, 7B, 7C, 8A and 8B are cross-sectional views illustrating processes of a method of manufacturing the imaging device according to the first embodiment of the present invention.

FIG. 12 is a block diagram schematically illustrating a configuration of an imaging system according to a third embodiment of the present invention.

DESCRIPTION OF THE EMBODIMENTS

Preferred embodiments of the present invention will now be described in detail in accordance with the accompanying drawings.

[First Embodiment]

An imaging device and a manufacturing method thereof according to a first embodiment of the present invention will hereinafter be described with reference to FIGS. 1 through 8B.

Figure 1:
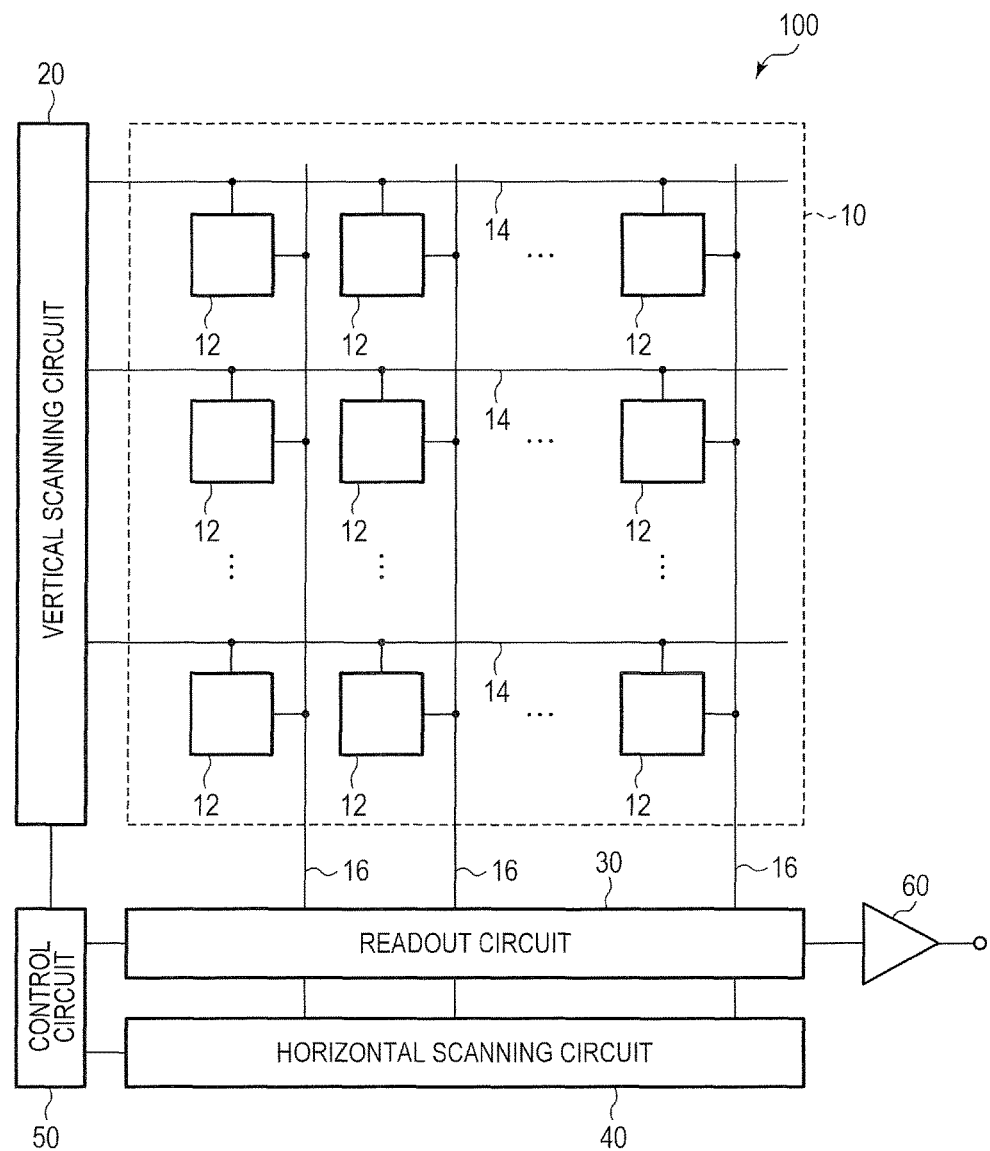
FIG. 1 is a block diagram schematically illustrating a configuration of an imaging device according to a first embodiment of the present invention.
Figure 2:
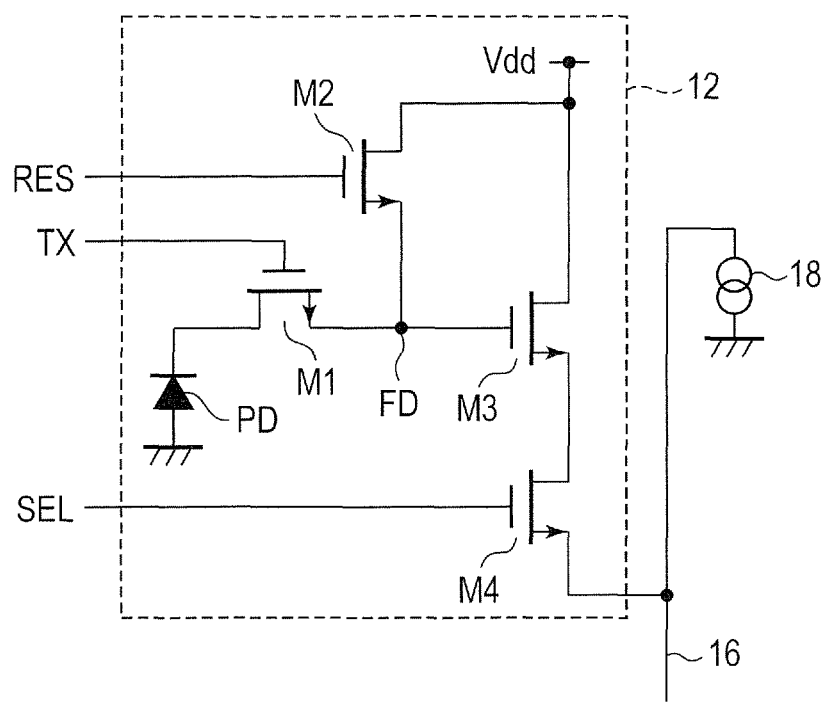
FIG. 2 is a diagram illustrating one example of a pixel circuit of the imaging device according to the first embodiment of the present invention.
Figure 3:
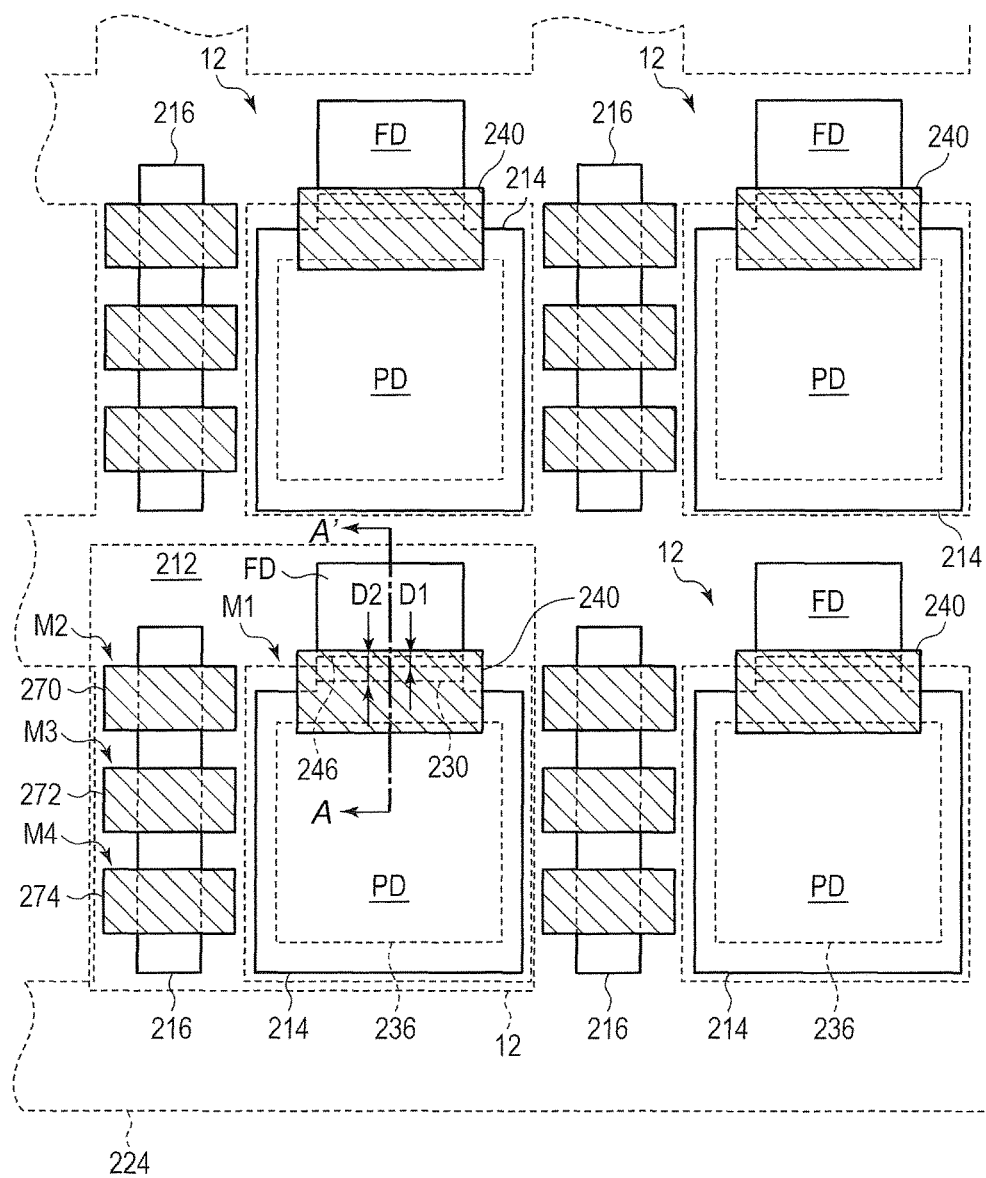
FIG. 3 is a plan view of the imaging device according to the first embodiment of the present invention.
Figure 4:
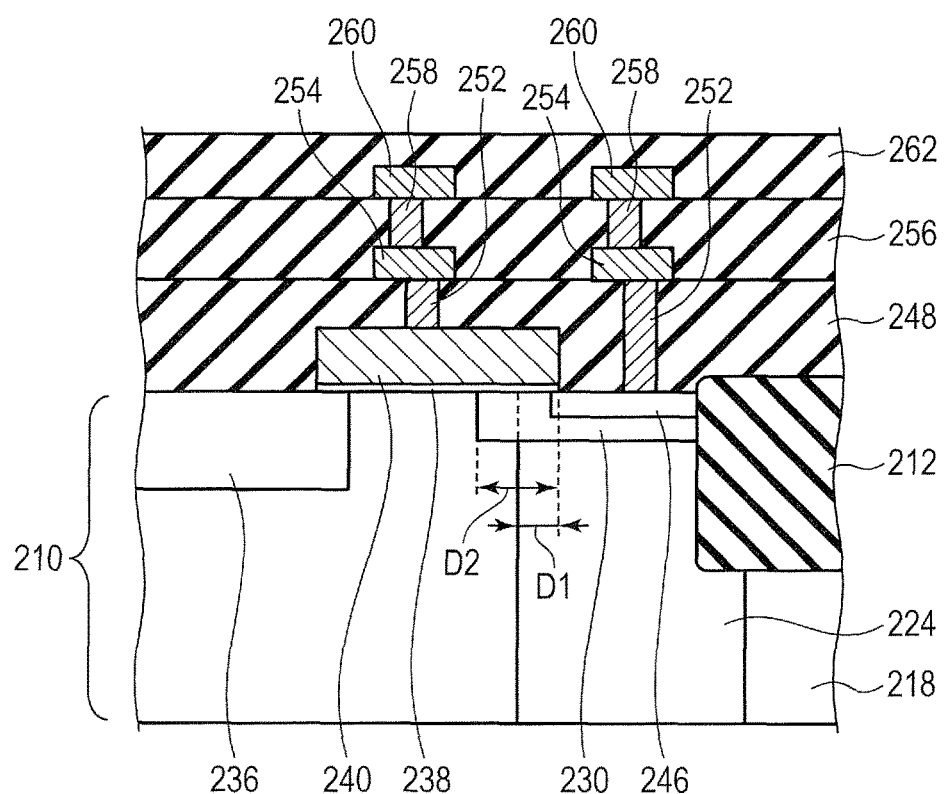
FIG. 4 is a schematic cross-sectional view of the imaging device according to the first embodiment of the present invention.
Figure 5A:
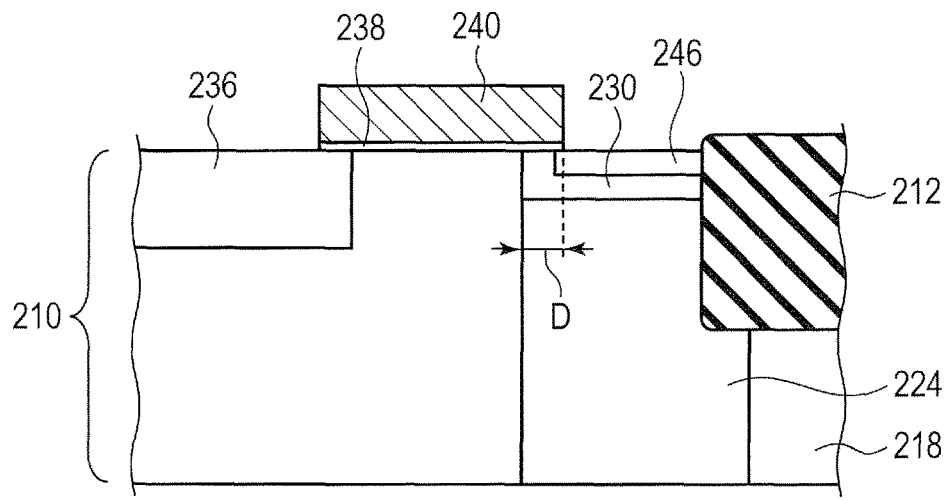
FIGS. 5A and 5B are cross-sectional views illustrating processes of a method of manufacturing an imaging device according to a comparative example.
Figure 5B:
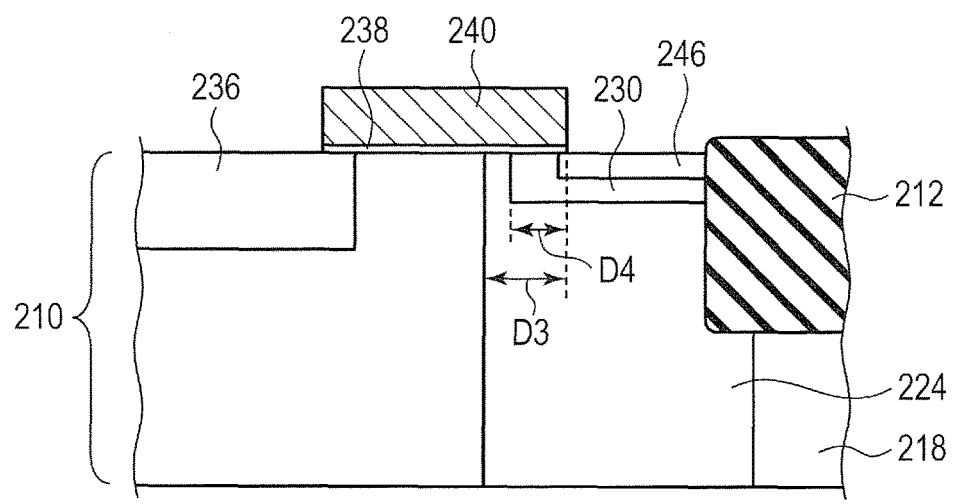

To start with, a structure of the imaging device according to the present embodiment will be described with reference to FIGS. 1 through 5B. FIG. 1 is a block diagram schematically illustrating a configuration of the imaging device according to the present embodiment. FIG. 2 is a diagram illustrating a pixel circuit of the imaging device according to the present embodiment. FIG. 3 is a plan view of the imaging device according to the present embodiment. FIG. 4 is a schematic cross-sectional view of the imaging device according to the present embodiment. FIGS. 5A and 5B are cross-sectional views illustrating processes of a method of manufacturing the imaging device according to a comparative example.

An imaging device 100 according to the present embodiment includes, as depicted in FIG. 1, a pixel region 10, a vertical scanning circuit 20, a column readout circuit 30, a horizontal scanning circuit 40, a control circuit 50, and an output circuit 60.

A plurality of pixels 12 two-dimensionally arranged over plural rows and plural columns in a matrix is provided in the pixel region 10. Control signal lines 14 extending in a row direction (a crosswise direction in FIG. 1) are arranged in respective rows of a pixel array of the pixel region 10. The control signal lines 14 are connected respectively to the pixels 12 arranged in the row direction, thereby configuring the signal lines common to the pixels 12. Vertical output lines 16 extending in a column direction (a lengthwise direction in FIG. 1) are arranged in respective columns of the pixel array of the pixel region 10. The vertical output lines 16 are connected to the pixels 12 arranged in the column direction, thereby configuring the signal lines common to the pixels 12.

The control signal line 14 of each row is connected to the vertical scanning circuit 20. The vertical scanning circuit 20 is a circuit unit that supplies the pixels 12 via the control signal lines 14 with control signals for driving readout circuits within the pixels 12 when reading pixel signals from the pixels 12. One ends of the vertical output lines 16 in the respective columns are connected to the column readout circuit 30. The pixel signals read out from the pixels 12 are inputted to the column readout circuit 30 via the vertical output lines 16. The column readout circuit is a circuit unit that executes predetermined signal processing, e.g., an amplifying process, an AD conversion process and other equivalent processes for the pixel signals read out from the pixels 12. The column readout circuit 30 may include a differential amplifier circuit, a sample and hold circuit, an AD conversion circuit and other equivalent circuits.

The horizontal scanning circuit 40 is a circuit unit that supplies the column readout circuit 30 with the control signals for transferring the pixel signals processed by the column readout circuit 30 to the output circuit 60 sequentially on a column-by-column basis. The control circuit 50 is a circuit unit that supplies the control signals for controlling operations and operation timings of the vertical scanning circuit 20, the column readout circuit and the horizontal scanning circuit 40. The output circuit 60 is a circuit unit, which is configured by including a buffer amplifier, a differential amplifier and other equivalent amplifiers, and outputs the pixel signals read out from the column readout circuit 30 to an external signal processing unit provided outside of the imaging device.

Each pixel 12 includes, as illustrated in FIG. 2, a photoelectric conversion unit PD, a transfer transistor M1, a reset transistor M2, an amplifier transistor M3, and a select transistor M4. The photoelectric conversion unit PD is, e.g., a photodiode, of which an anode is connected to a ground voltage line, and a cathode is connected to a drain of the transfer transistor M1. A source of the transfer transistor M1 is connected to a source of the reset transistor M2 and to a gate of the amplifier transistor M3. A connection node of the source of the transfer transistor M1, the source of the reset transistor M2 and the gate of the amplifier transistor M3 is a so-called floating diffusion (FD) region, and configures a charge/voltage conversion unit including a capacitor parasitically coupled to this connection node. The transfer transistor M1 includes a function of transferring a signal charge generated by the photoelectric conversion unit PD to the FD region. Drains of the reset transistor M2 and the amplifier transistor M3 are connected to a power supply voltage line (Vdd). A source of the amplifier transistor M3 is connected to a drain of the select transistor M4. A source of the select transistor M4 is connected to the vertical output line 16. Connected to the other end of the vertical output line 16 is a current source 18 for configuring a source follower circuit by supplying a bias current to the amplifier transistor M3.

The control signal line 14 includes, when taking the circuit configuration illustrated in FIG. 2, a transfer gate signal line TX, a reset signal line RES, and a select signal line SEL. The transfer gate signal line TX is connected to the gate of the transfer transistor M1. The reset signal line RES is connected to the gate of the reset transistor M2. The select signal line SEL is connected to the gate of the select transistor M4.

FIG. 3 illustrates one example of a planar layout of the four pixels 12 extracted from the pixel region 10 in FIG. 1. FIG. 4 is a schematic cross-sectional view taken along a line A-A' in FIG. 3.

A surface portion of a semiconductor substrate 210 is provided with a p-type semiconductor region 218 configuring a p-well. A surface portion of the p-type semiconductor region 218 is provided with a device isolation region 212 defining active regions 214, 216. The active region 214 is a region in which the photoelectric conversion unit PD and the transfer transistor M1 in the components of the pixel 12 depicted in FIG. 2 are disposed. The active region 216 is a region in which the reset transistor M2, the amplifier transistor M3 and the select transistor M4 in the components of the pixel 12 depicted in FIG. 2 are disposed.

A surface portion of the p-type semiconductor region 218 of the active region 214 is provided with an n-type semiconductor region 236 and an n-type semiconductor region 246 that are spaced away from each other. The n-type semiconductor region 236 forms a p-n junction between the p-type semiconductor region 218 and the n-type semiconductor region 236 itself, and configures the photodiode serving as the photoelectric conversion unit PD. The photoelectric conversion unit PD may also be configured as a buried photodiode with a p-type semiconductor region being further provided on the surface portion of the n-type semiconductor region 236. A gate electrode 240 is provided over the semiconductor substrate 210 between the n-type semiconductor region 236 and the n-type semiconductor region 246 with a gate insulating film 238 interposed therebetween. The transfer transistor M1 is thereby configured, in which the n-type semiconductor region 246 serves as the source, the n-type semiconductor region 236 serves as the drain, and the gate electrode 240 serves as the gate.

A p-type semiconductor region 224 is provided in a region deeper than the n-type semiconductor region 246 of the p-type semiconductor region 218. The p-type semiconductor region 224 functions as a potential barrier for preventing an electric charge generated by the photoelectric conversion unit PD of the adjacent pixel 12 from flowing into the n-type semiconductor region 246. For example, in the planar layout in FIG. 3, the p-type semiconductor region 224 is provided in mesh to surround the n-type semiconductor region 236, and prevents the electric charge generated in a certain pixel 12 from flowing into another adjacent pixel 12.

A counter doped region 230 is provided along a periphery of the n-type semiconductor region 246. The counter doped region 230 is provided over a region deeper than the n-type semiconductor region 246 from the surface of the semiconductor substrate 210. The counter doped region 230 serves to compensate carriers based on a p-type impurity implanted in the vicinity of the surface of the semiconductor substrate 210 when forming the p-type semiconductor region 224. It may be sufficient that the counter doped region 230 contains an n-type impurity having a concentration sufficient for compensating the p-type carriers based on the p-type impurity implanted in the vicinity of the surface of the semiconductor substrate 210 when forming the p-type semiconductor region 224, and a net conductivity-type thereof may be either n-type or p-type.

To describe this more specifically, a concentration of the p-type carrier, in the depth at which to provide the counter doped region 230, of the region in which the p-type semiconductor region 224 and the gate electrode 240 are overlapped with each other as viewed in a plan view, is not more than a concentration of the p-type carrier in the p-type semiconductor region 218 in the same depth. The concentration of the p-type carrier in the p-type semiconductor region 218 is, as connoted herein, the concentration of the p-type carrier of the p-type semiconductor region 218 with respect to a region provided with neither the p-type semiconductor region 224 nor the counter doped region 230.

Note that "counter doping" is defined as a technique for introducing an impurity having an opposite conductivity-type into the semiconductor region having a specific conductivity-type. In the example of the present embodiment, the counter doped region 230 is the region in which the impurity of the opposite conductivity-type, i.e., n-type is introduced into the p-type semiconductor regions 218, 224.

The p-type semiconductor region 224 is, as illustrated in FIG. 3, disposed to surround the n-type semiconductor region 236 as viewed in a plan view. At least a part of the p-type semiconductor region 224 and the counter doped region 230 are disposed in the way of being overlapped with the gate electrode 240 as viewed in a plan view. To be specific, the p-type semiconductor region 224 is disposed so that an overlap of the p-type semiconductor region 224 with respect to the gate electrode 240 of the transfer transistor M1 becomes "D1" as viewed in a plan view. The counter doped region 230 is disposed so that an overlap of the counter doped region 230 with respect to the gate electrode 240 of the transfer transistor M1 becomes "D2" as viewed in a plan view. A relationship between these overlaps is given such as D1<D2.

The active region 216 is provided with the reset transistor M2 including a gate electrode 270, the amplifier transistor M3 including a gate electrode 272, and the select transistor M4 including a gate electrode 274. Note that one or two transistors of these transistors may be formed respectively in separate active regions.

An inter-layer insulating film 248 is provided on the semiconductor substrate 210 provided with the photoelectric conversion unit PD, the transfer transistor M1, the reset transistor M2, the amplifier transistor M3 and the select transistor M4. A first-level interconnection layer 254 connected to the transfer transistor M1 via a contact plug 252 is provided on the inter-layer insulating film 248. An inter-layer insulating film 256 is provided on the inter-layer insulating film 248 provided with the first-level interconnection layer 254. A second-level interconnection layer 260 connected to the first-level interconnection layer 254 via a via-plug 258 is provided on the inter-layer insulating film 256. A passivation film 262 is provided on the inter-layer insulating film 256 provided with the second-level interconnection layer 260.

Thus, in the imaging device according to the present embodiment, as viewed in a plan view, the overlap D2 of the counter doped region 230 with respect to the gate electrode 240 is larger than the overlap D1 of the p-type semiconductor region 224 with respect to the gate electrode 240. This derives from the following reason.

As described above, the p-type semiconductor region 224 functions as the potential barrier for preventing the signal charge generated by the photoelectric conversion unit PD of the adjacent pixel 12 from flowing into the n-type semiconductor region 246. It is desirable for this purpose that the p-type semiconductor region 224 is formed in the region deeper than the n-type semiconductor region 246 of the semiconductor substrate 210. However, with downsizing of the pixel, there increases an aspect ratio of an opening of a photoresist film used for forming the p-type semiconductor region 224, and there is an increasing tendency of a rate of impurity ions decelerating with iterated reflective collisions against side walls of the opening when implanting the ions. As a result, a concentration of the p-type impurity in the vicinity of the surface of the semiconductor substrate 210 rises as compared with an impurity profile assumed from acceleration energy of the impurity ions. When this phenomenon occurs in the vicinity of the gate electrode 240 of the transfer transistor M1, a transfer failure is caused by becoming the potential barrier when transferring the electric charge, resulting in causing deterioration of pixel performance.

The counter doped region 230 is provided for relieving the potential barrier by compensating the p-type carriers based on the p-type impurity introduced in the vicinity of the surface of the semiconductor substrate 210 when forming the p-type semiconductor region 224. The counter doped region 230 can be formed by using the photoresist film employed when forming the p-type semiconductor region 224 as written in Japanese Patent Application Laid-Open No. 2011-171511. In this case, immediately after implanting the ions, the overlap D with respect to the gate electrode 240 becomes, as illustrated in, e.g., FIG. 5A, substantially equal in the counter doped region 230 and the p-type semiconductor region 224.

The n-type impurity and the p-type impurity are generally, however, different in diffusion coefficient, and hence it follows that the overlap D with respect to the gate electrode 240 after carrying out a thermal treatment during a manufacturing step becomes different in the counter doped region 230 and in the p-type semiconductor region 224. For example, the diffusion coefficient of the p-type impurity is larger than the diffusion coefficient of the n-type impurity, in which case, as depicted in FIG. 5B, an overlap D3 of the p-type semiconductor region 224 becomes larger than an overlap D4 of the counter doped region 230. In other words, it follows that a region having a locally high concentration of the p-type impurity due to the p-type semiconductor region 224 occurs in a channel region of the transfer transistor M1.

The potential barrier is thereby disabled from being relieved by the counter doped region 230, and this causes the transfer failure of the transfer transistor M1. Especially, boron defined as a typical p-type impurity has a relatively large diffusion coefficient in silicon against phosphorus and arsenic as typical n-type impurities, and therefore this tendency becomes conspicuous.

On the other hand, according to the present embodiment, the p-type semiconductor region 224 and the counter doped region 230 are formed so that the overlap D2 of the counter doped region 230 with respect to the gate electrode 240 is larger than the overlap D1 of the p-type semiconductor region 224 with respect to the gate electrode 240. A contrivance being thus made, the potential barrier based on the p-type semiconductor region 224 can be sufficiently relieved by the counter doped region 230. The transfer performance of the transfer transistor M1 can be thereby maintained while restraining the inflow of the signal charge from the adjacent pixel 12 by the p-type semiconductor region 224.

Next, a method of manufacturing the imaging device according to the present embodiment will be described with reference to FIG. 6A to FIG. 8B. FIG. 6A to FIG. 8B are cross-sectional views illustrating processes of the method of manufacturing the imaging device according to the present embodiment. Note that the method of manufacturing the imaging device will be described herein in a way that focuses on constructive portions appearing on the cross-section taken along the line A-A' in FIG. 3.

At first, the device isolation region 212 for defining the active region 214 is formed on the surface portion of the semiconductor substrate 210, e.g., an n-type silicon substrate. The device isolation region 212 can be formed by a known method instanced by an STI (Shallow Trench Isolation) method and a LOCOS (LOCal Oxidation of Silicon) method.

Subsequently, after implanting p-type impurities by ion implantation, the implanted impurities are electrically activated by thermal treatment, thus forming the p-type semiconductor region 218 serving as the p-well in the surface portion of the semiconductor substrate 210 (FIG. 6A).

A photoresist film 220 having an opening 222 in a region designed to form the p-type semiconductor region 224 is formed over the semiconductor substrate 210 by photolithography.

Next, the p-type semiconductor region 224 is formed in the semiconductor substrate 210 within the opening 222 by implanting p-type impurity ions, e.g., the boron ions with the photoresist film 220 serving as a mask (FIG. 6B). The p-type semiconductor region 224 may be configured by one semiconductor region continuing in a depthwise direction, and may also be configured by a plurality of semiconductor regions disposed at different depths. The p-type semiconductor region 224 is formed to have at least an impurity concentration, e.g., about $1 \times 10^{17}$ cm$^{-3}$ required for forming the potential barrier for preventing the inflow of the charge from the adjacent pixel.

Note that the p-type semiconductor region 224 is actually formed by electrically activating the implanted impurities by the following thermal treatment, and in the present specification, however, the p-type semiconductor region 224 is written inclusively of a state immediately after implanting the ions in order to prevent intricacy of the description. The same is applied to other semiconductor regions formed by ion implantation.

When an aspect ratio of the opening 222 of the photoresist film 220 increases with the downsizing of the pixels, there rises the rate of impurity ions decelerating with the iterated reflective collisions against the side walls of the opening 222 upon implanting the ions. As a result, the concentration of the p-type impurity in the vicinity of the surface of the semiconductor substrate 210 rises as compared with the impurity depth profile assumed from the acceleration energy of the impurity ions.

Subsequently, after removing the photoresist film 220 by, e.g., asking, a photoresist film 226 having an opening 228 in a region designed to form the counter doped region 230 is formed over the semiconductor substrate 210 by the photolithography. On this occasion, the opening 228 to take a wider pattern on the side of the n-type semiconductor region 236 (on the left side in the drawing) than the opening 222. The patterns of the opening 222 and the opening 228 are properly laid out so that the foregoing overlaps D1, D2 satisfy the relationship "D1<D2" when completing the imaging device.

Successively, the counter doped region 230 is formed in the surface portion of the semiconductor substrate 210 within the opening 228 by implanting the n-type impurity ions, e.g., the phosphorus ions or the arsenic ions with the photoresist film 226 serving as the mask (FIG. 6C). The counter doped region 230 is formed to have at least the impurity concentration needed for compensating the p-type carrier based on the p-type impurity implanted unintentionally in the vicinity of the surface of the semiconductor substrate 210 by the reflective collisions against the side walls of the opening 222 when forming the p-type semiconductor region 224. For example, the counter doped region 230 is formed to have the impurity concentration not less than $1 \times 10^{16}$ cm$^{-3}$.

According to the present embodiment, the counter doped region 230 is formed before forming the gate electrode 240 of the transfer transistor M1. This derives from the following reason.

It is desirable for the p-type semiconductor regions 224 to be disposed in optically symmetric positions, and the overlap D1 is requested to be ensured large depending on the pixel size. In this case, when forming the counter doped region 230 after forming the gate electrode 240 of the transfer transistor M1, it is difficult to satisfy the relationship "D1<D2" as the case may be. In such a case, it is desirable that the counter doped region 230 is formed before forming the gate electrode 240 of the transfer transistor M1.

The counter doped region 230 is a region for compensating the p-type carrier based on the p-type impurities introduced into the channel region of the transfer transistor M1 when forming the p-type semiconductor region 224, and is desired to be formed in a region shallower than the n-type semiconductor region 236.

Subsequently, after removing the photoresist film 226 by, e.g., asking, a photoresist film 232 having an opening 234 in a region designed to form the n-type semiconductor region 236 is formed over the semiconductor substrate 210 by the photolithography.

Figure 7A:
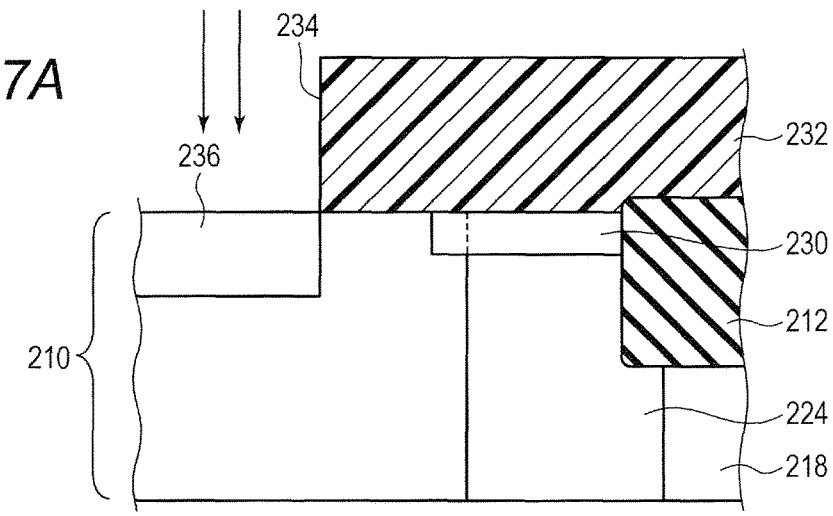

Successively, the n-type semiconductor region 236 is formed in the surface portion of the semiconductor substrate 210 within the opening 234 by implanting the n-type impurity ions, e.g., the phosphorus ions or the arsenic ions with the photoresist film 232 serving as the mask (FIG. 7A). Thus, the photoelectric conversion unit PD configured by the p-n junction between the p-type semiconductor region 218 and the n-type semiconductor region 236 is formed in the active region 214.

Subsequently, after removing the photoresist film 232 by, e.g., asking, the gate insulating film 238 of, e.g., a silicon oxide film is formed on the surface portion of the active region 214 by, e.g., a thermal oxidation method.

Figure 7B:
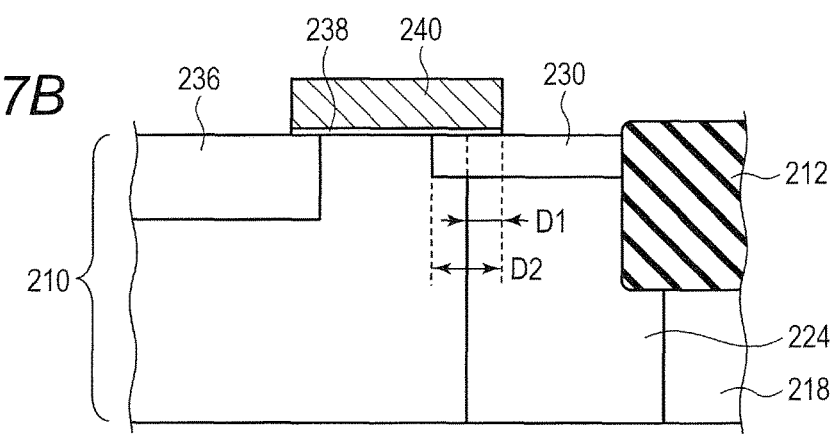

Next, after a conductive film instanced by a polycrystalline silicon film is deposited by, e.g., CVD (Chemical Vapor Deposition) method, the conductive film undergoes patterning by using the photolithography and anisotropic dry etching, thereby forming the gate electrode 240 (FIG. 7B). On this occasion, the gate electrode 240 is disposed so that the overlap D1 between the p-type semiconductor region 224 and the gate electrode 240 and the overlap D2 between the counter doped region 230 and the gate electrode 240 satisfy the relationship "D1<D2."

Subsequently, a photoresist film 242 having an opening 244 in a region designed to form the n-type semiconductor region 246 is formed over the semiconductor substrate 210 by the photolithography.

Figure 7C:
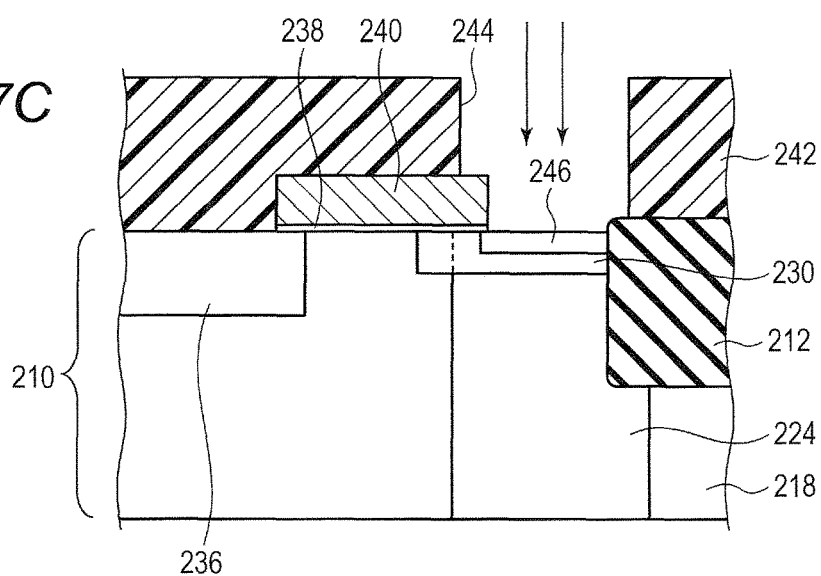

Successively, the n-type semiconductor region 246 is formed in the surface portion of the semiconductor substrate 210 within the opening 244 by implanting the n-type impurity ions, e.g., the phosphorus ions or the arsenic ions with the photoresist film 242 and the gate electrode 240 serving as the masks (FIG. 7C). Thus, the transfer transistor M1 is formed in the active region 214, in which the n-type semiconductor region 236 serves as the source thereof, the n-type semiconductor region 246 serves as the drain, and the gate electrode 240 serves as the gate.

Next, after, e.g., the silicon oxide film is deposited by, e.g., CVD method over the semiconductor substrate 210 formed with the photoelectric conversion unit PD and the transfer transistor M1, the surface thereof is planarized by CMP (Chemical Mechanical Polishing) method, thus forming the inter-layer insulating film 248.

Subsequently, the inter-layer insulating film 248 undergoes the patterning by using the photolithography and the anisotropic dry etching, and contact holes 250 reaching the gate electrode 240 and the n-type semiconductor region 246 of the transfer transistor M1 are formed in the inter-layer insulating film 248.

Successively, after depositing the conductive film, the conductive film on the inter-layer insulating film 248 is etched back or polished back, thereby forming a contact plug 252 embedded in the contact hole 250.

Figure 8A:
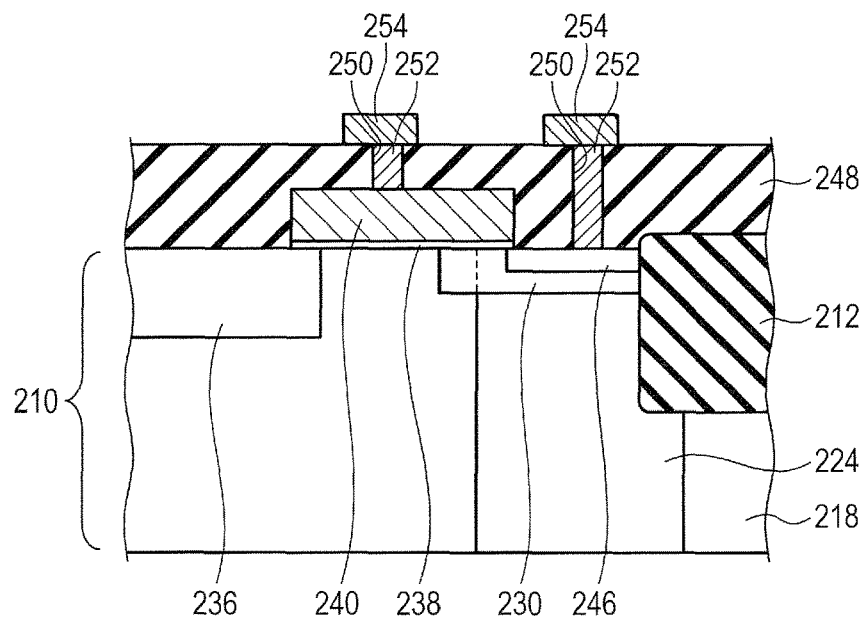

Next, the first-level interconnection layer 254 connected to the gate electrode 240 or the n-type semiconductor region 246 via the contact plug 252 is formed by depositing the conductive film on the inter-layer insulating film 248 including the embedded contact plug 252 and by performing the patterning thereon (FIG. 8A).

Subsequently, in the same way as the inter-layer insulating film 248, the contact plug 252 and the first-level interconnection layer 254, an inter-layer insulating film 256, a via plug 258 and the second-level interconnection layer 260 are respectively formed over the inter-layer insulating film 248.

Figure 8B:
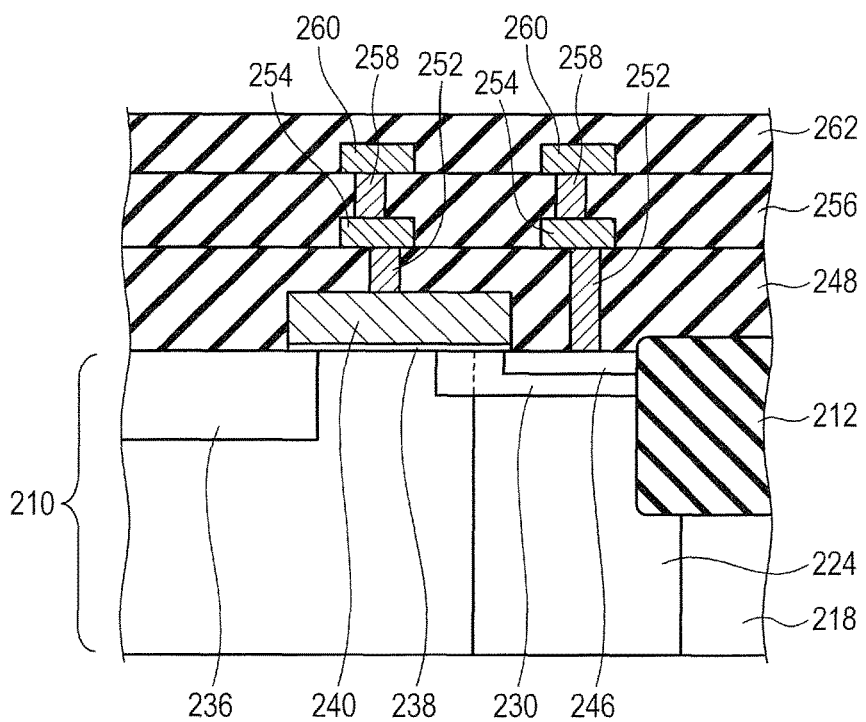

Next, after further forming interconnection layers as a necessity arises, the passivation film 262 is formed (FIG. 8B).

Thereafter, a color filter, a micro lens, etc., which are herein unillustrated, are formed over the passivation film 262, thereby completing the imaging device according to the present embodiment.

Thus, according to the present embodiment, the overlap D2 of the counter doped region 230 with respect to the gate electrode 240 of the transfer transistor M1 can be set larger than the overlap D1 of the p-type semiconductor region 224 with respect to the gate electrode 240 of the transfer transistor M1. A leakage of the signal charge into the adjacent pixel can be thereby restrained without causing the deterioration of the transfer performance of the transfer transistor M1.

[Second Embodiment]

A method of manufacturing an imaging device according to a second embodiment of the present invention will be described with reference to FIG. 9 to FIG. 11B. The same components of the imaging device and the manufacturing method thereof as the components thereof according to the first embodiment illustrated in FIG. 1 to FIG. 8B are marked with the same symbols and numerals, and the repetitive explanations thereof are omitted or simplified.

Figure 9:
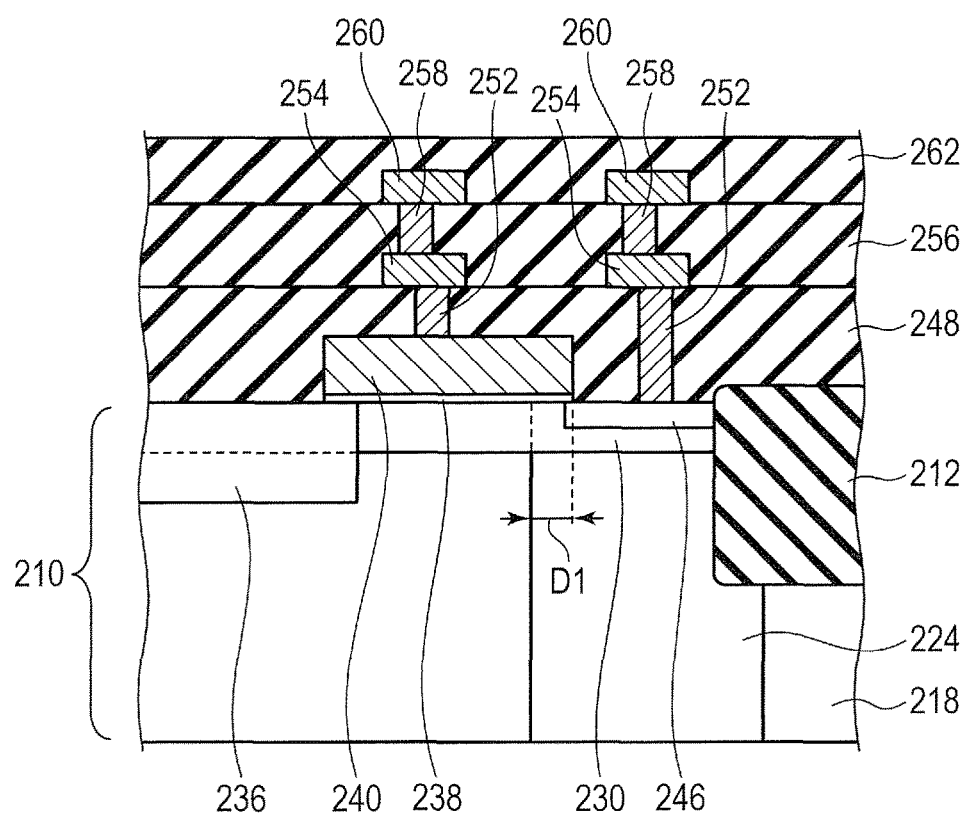
FIG. 9 is a schematic cross-sectional view of an imaging device according to a second embodiment of the present invention.

To begin with, a structure of the imaging device according to the present embodiment will be described with reference to FIG. 9. FIG. 9 is a schematic cross-sectional view of the imaging device according to the present embodiment.

The imaging device according to the present embodiment is the same as the imaging device according to the first embodiment illustrated in FIG. 4 except a difference of the disposing position of the counter doped region 230. To be specific, in the imaging device according to the present embodiment, the counter doped region 230 is formed over the entire surface portion of the active region 214. In this case also, the overlap D2 of the counter doped region 230 with respect to the gate electrode 240 is, similarly to the first embodiment, said to be larger than the overlap D1 of the p-type semiconductor region 224 with respect to the gate electrode 240.

The counter doped region 230 is formed over the entire surface portion of the active region 214, whereby it does not happen that the p-type semiconductor region 224 is formed in the channel region of the transfer transistor M1 beyond the counter doped region 230. In other words, it is feasible to prevent the potential barrier from occurring under the gate electrode 240 of the transfer transistor M1 irrespective of a manufacturing fluctuation of the overlap D1 of the p-type semiconductor region 224 with respect to the gate electrode 240. A much stronger pixel structure against the manufacturing fluctuation can be thereby attained.

Next, the method of manufacturing the imaging device according to the present embodiment will be described with reference to FIG. 10A to FIG. 11B. FIG. 10A to FIG. 11B are cross-sectional views illustrating processes of the method of manufacturing the imaging device according to the present embodiment.

In the same way as the method of manufacturing the imaging device according to the first embodiment depicted in FIG. 6A and FIG. 6B, the p-type semiconductor region 218, the device isolation region 212 and the p-type semiconductor region 224 are formed in the semiconductor substrate 210.

Figure 10A:
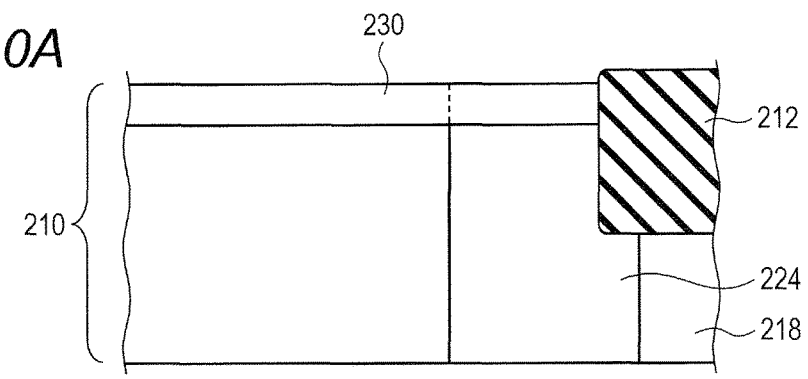
FIGS. 10A, 10B, 10C, 11A and 11B are cross-sectional views illustrating processes of a method of manufacturing the imaging device according to the second embodiment of the present invention.

Subsequently, the counter doped region 230 is formed by ion implantation in the surface portion of at least the active region 214 (FIG. 10A). The counter doped region 230 may be formed in the overall surface of the semiconductor substrate 210 without using the photoresist film 226, and may also be formed by using, as the mask, the photoresist film 226 including the opening 228 from which the whole of at least the active region 214 is exposed.

Note that the counter doped region 230 is provided in the overall surface of the channel region of the transfer transistor M1 in the imaging device according to the present embodiment. Therefore, when the net conductivity-type of the counter doped region 230 is inverted to the n-type, the transfer transistor M1 falls into a depletion type. In the case of using the transfer transistor M1 as a typical enhancement type, the dosage of the n-type impurities is properly adjusted not to cause the n-type inversion of part of at least the channel region.

Figure 10B:
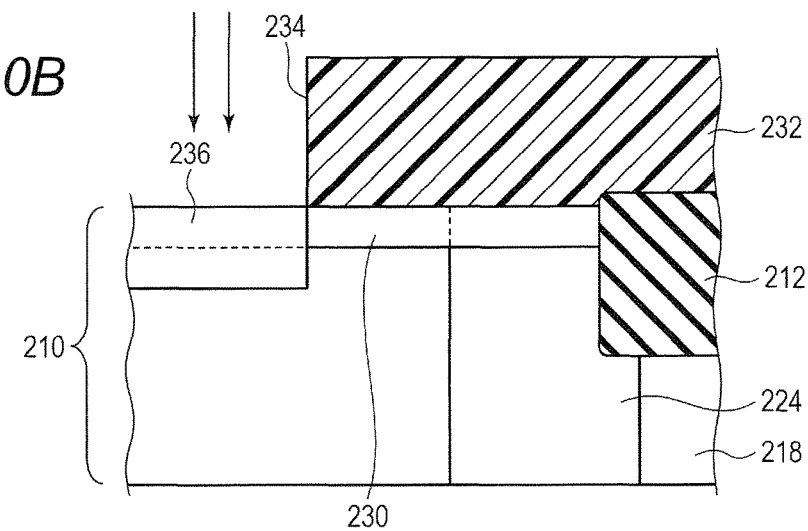

Successively, the n-type semiconductor region 236 is formed in the surface portion of the semiconductor substrate 210 in the same way as the method of manufacturing the imaging device according to the first embodiment illustrated in FIG. 7A (FIG. 10B).

Figure 10C:
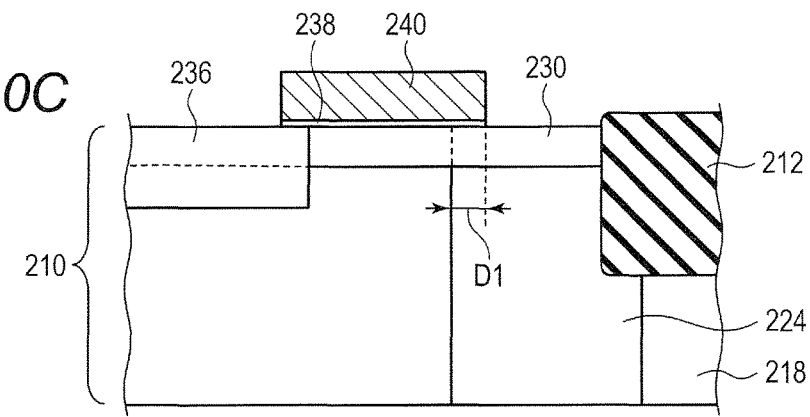

Next, the gate insulating film 238 and the gate electrode 240 are formed in the same way as the method of manufacturing the imaging device according to the first embodiment illustrated in FIG. 7B (FIG. 10C). On this occasion, the overlap between the p-type semiconductor region 224 and the gate electrode 240 is set to "D1."

Figure 11A:
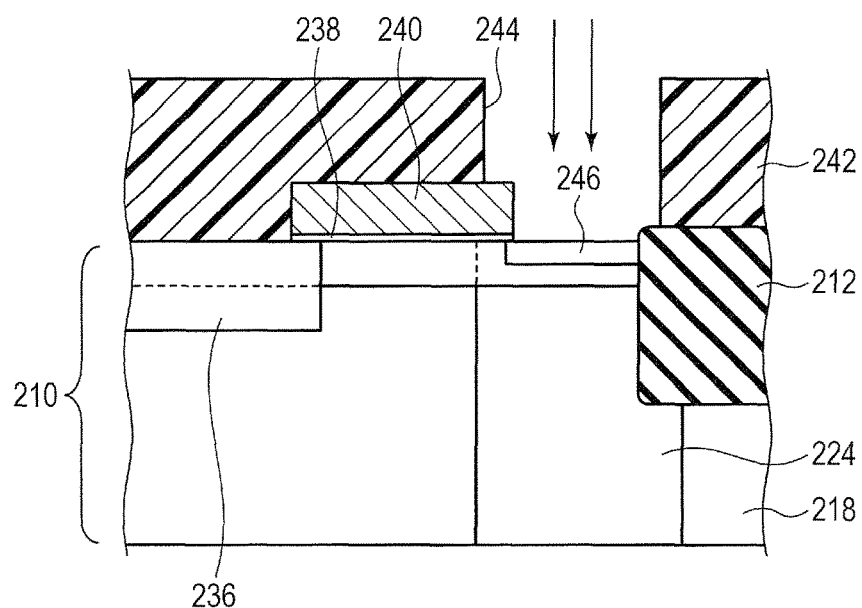

Subsequently, the n-type semiconductor region 246 is formed in the surface portion of the semiconductor substrate 210 in the same way as the method of manufacturing the imaging device according to the first embodiment illustrated in FIG. 7C (FIG. 11A).

Next, the inter-layer insulating film 248, the contact plug 252 and the first-level interconnection layer 254 are respectively formed in the same way as the method of manufacturing the imaging device according to the first embodiment illustrated in FIG. 8A and FIG. 8B.

Figure 11B:
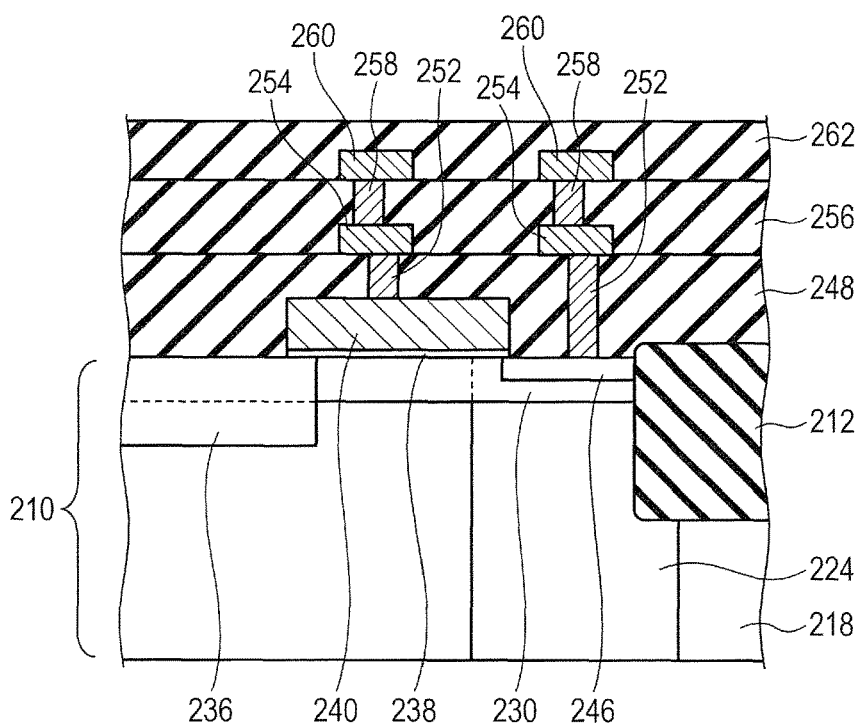

Successively, the inter-layer insulating film 256, the via plug 258, the second-level interconnection layer 260 and the passivation film 262 are respectively formed in the same way as the method of manufacturing the imaging device according to the first embodiment illustrated in FIG. 8B (FIG. 11B).

Thereafter, the color filter, the micro lens, etc., which are herein unillustrated, are formed, thereby completing the imaging device according to the present embodiment.

Thus, according to the second embodiment, the overlap of the counter doped region 230 with respect to the gate electrode 240 of the transfer transistor M1 can be set larger than the overlap D1 of the p-type semiconductor region 224 with respect to the gate electrode 240 of the transfer transistor M1. A leakage of the signal charge into the adjacent pixel can be thereby restrained without causing the deterioration of the transfer performance of the transfer transistor M1.

It is feasible to prevent the potential barrier from occurring under the gate electrode 240 of the transfer transistor M1 even when the manufacturing fluctuation occurs in the overlap D1, and hence the much stronger pixel structure against the manufacturing fluctuation can be attained.

[Third Embodiment]

An imaging system according to a third embodiment of the present invention will be described with reference to FIG. 12. FIG. 12 is a block diagram illustrating an example of a configuration of the imaging system according to the present embodiment.

The imaging device 100 described in the first and second embodiments are applicable to a variety of imaging systems. The applicable imaging systems are exemplified by a digital still camera, a digital camcorder, a monitor camera, a copying machine, a facsimile, a mobile phone, an on-vehicle camera, and an observation satellite. The imaging system includes a camera module equipped with an optical system instanced by lenses and with the imaging device. FIG. 12 illustrates a block diagram of the digital still camera by way of one of these examples.

An imaging system 1000 illustrated in FIG. 13 includes an imaging device 100, a lens 1002 for forming an optical image of an object on the imaging device 100, an aperture 1004 for making variable a quantity of light passing through the lens 1002, and a barrier 1006 for protecting the lens 1002. The lens 1002 and the aperture 1004 are classified as the optical system for condensing the light on the imaging device 100. The imaging device 100, which is identical with the imaging device 100 described in the first or second embodiment, converts the optical image formed by the lens 1002 into image data, and outputs the converted image data as an image signal.

The imaging system 1000 includes a signal processing unit 1008 that processes an output signal outputted from the imaging device 100. The signal processing unit 1008 performs an AD-conversion of an analog signal output from the imaging device 100 into a digital signal. In addition, the signal processing unit 1008 conducts an operation of outputting the image data by performing a variety of corrections and compressions according to the necessity. An AD conversion unit serving as part of the signal processing unit 1008 may be formed on the semiconductor substrate provided with the imaging device 100, and may also be formed on another semiconductor substrate different from the imaging device 100. The imaging device 100 and the signal processing unit 1008 may also be formed on the same semiconductor substrate.

The imaging system 1000 further includes a memory unit 1014 for temporarily storing the image data, and an external interface unit (external I/F unit) 1018 for performing the communications with external computers and other equivalent apparatuses. The imaging system 1000 still further includes a storage medium 1020 instanced by a semiconductor memory for recording or reading the imaging data, and a storage medium control interface unit (storage medium control I/F unit) 1016 for recording or reading to or from the storage medium 1020. Note that the storage medium 1020 may be built in and may also be removable from the imaging system 1000.

The imaging system 1000 yet further includes a general control/operation unit 1012 that controls driving of the whole digital still camera and a variety of arithmetic processes, and a timing generation unit 1010 that outputs a variety of timing signals to the imaging device 100 and the signal processing unit 100. Herein, the timing signals may be inputted from outside, and it may be sufficient that the imaging system 1000 includes at least the imaging device 100 and the signal processing unit 1008 that processes output signals outputted from the imaging device 100.

The imaging system 1000, to which the imaging device 100 according to the first or second embodiment is applied, is thus configured, thereby enabling the attainment of the high-performance imaging system capable of acquiring the high-definition image while restraining color mixing due to the leakage of the signal charge into the adjacent pixel.

[Modified Embodiments]

The present invention can be modified in a variety of forms without being limited to the embodiments described above.

For example, the counter doped region 230 is formed before forming the gate electrode 240 according to the embodiments described above, and may, however, be formed after forming the gate electrode 240, depending on a value of the overlap D2. In this case, it is effective to implant the ions from a direction inclined to a direction normal to the semiconductor substrate 210 in order to ensure the much larger overlap D2.

The counter doped region 230 is formed after forming the p-type semiconductor region 224 according to the embodiments described above, and the p-type semiconductor region 224 may, however, be formed after forming the counter doped region 230.

The p-type semiconductor region 224 is disposed in mesh to surround the n-type semiconductor region 236 according to the embodiments described above and may, however, be disposed without being limited to this disposing position. For example, in FIG. 3, the p-type semiconductor region 224 may be disposed in stripe to cover a region between the photoelectric conversion units PD of the pixels 12 adjacent to each other in the lengthwise direction. Alternatively, the p-type semiconductor region 224 may also be disposed in only a region under the n-type semiconductor region 246.

The foregoing embodiments have been described so far by exemplifying the example that the readout circuit of the pixel 12 is configured by the n-channel MOS transistors, and the readout circuit of the pixel 12 can be, however, configured by p-channel MOS transistors. In this case, the conductivity-types of the respective semiconductor regions described in the embodiments become opposite conductivity-types. Note that nomenclatures of the source and the drain of the respective transistors written in the embodiments are one example, and these transistor parts are called by reverse nomenclatures depending on the conductivity-types of the transistors and their functions to be focused on as the case may be.

The pixel circuit illustrated in FIG. 2 is one example, and the embodiments are not limited to this example. For instance, between the photoelectric conversion unit PD and the FD regions, the two transfer transistors are provided in the way of a charge holding unit being interposed therebetween, and the pixels may be configured to enable a global electronic shutter operation. In this instance, the present invention can be applied to a second transfer transistor that transfers the charge to the FD region from the charge holding unit. One pixel may include a plurality of photoelectric conversion units PD and a plurality of transfer transistors M1 corresponding to these photoelectric conversion units PD. The pixel plane layout illustrated in FIG. 3 is also one example, and the embodiments are not limited to this example.

The imaging system exemplified in the third embodiment is one example of the imaging systems to which the imaging device of the present invention can be applied, and the imaging systems to which the imaging device of the present invention is applicable are not limited to the configuration illustrated in FIG. 12.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-082624, filed Apr. 18, 2016, which is hereby incorporated by reference herein in its entirety.

What is claimed is:

1. An imaging device comprising:
a plurality of pixels disposed two-dimensionally, each of the plural pixels including:
a photoelectric conversion unit provided in a first semiconductor region of a first conductivity type;
a transfer transistor including a second semiconductor region of a second conductivity type which is provided in the first semiconductor region and to which charge generated in the photoelectric conversion unit is transferred;
a third semiconductor region of the first conductivity type provided in a portion deeper than the second semiconductor region and having an impurity concentration higher than an impurity concentration of the first semiconductor region; and
a counter doped region provided around the second semiconductor region,
wherein at least a part of the third semiconductor region and at least a part of the counter doped region are overlapped with a gate electrode of the transfer transistor in a plan view, and
a first overlap of the counter doped region with respect to the gate electrode is larger than a second overlap of the third semiconductor region with respect to the gate electrode.

2. The imaging device according to claim 1, further comprising a fourth semiconductor region of the second conductivity type provided at the same depth as a depth at which the counter doped region is provided and overlapping the third semiconductor region and the gate electrode in a plan view.

3. The imaging device according to claim 1, further comprising a fourth semiconductor region of the first conductivity type provided at the same depth as a depth at which the counter doped region is provided and overlapping the third semiconductor region and the gate electrode in a plan view,
wherein a carrier concentration of the fourth semiconductor region of the first conductivity type is not more than a carrier concentration of the first conductivity type of a portion of the first semiconductor region, the portion being provided at the same depth as the depth at which the counter doped region is provided, and the portion overlapping with neither the third semiconductor region nor the counter doped region.

4. The imaging device according to claim 1, wherein the photoelectric conversion unit and the second semiconductor region of the transfer transistor are provided in an active region, and
the counter doped region is provided in an overall area of the active region in a plan view.

5. The imaging device according to claim 1, wherein the second semiconductor region is adjacent to the photoelectric conversion unit of another pixel with a device isolation region interposed therebetween, and
the third semiconductor region forms a potential barrier against the charge generated in the photoelectric conversion unit of the other pixel between the second semiconductor region and the photoelectric conversion unit of the other pixel.

6. The imaging device according to claim 1, wherein the transfer transistor further includes a fourth semiconductor region of the second conductivity type, and transfers the charge generated in the photoelectric conversion unit to the second semiconductor region from the fourth semiconductor region, and
the counter doped region is disposed in a region shallower than the fourth semiconductor region.

7. The imaging device according to claim 6, wherein the photoelectric conversion unit is configured by a p-n junction between the first semiconductor region and the fourth semiconductor region.

8. The imaging device according to claim 1, wherein the first conductivity type is a p-type, and the second conductivity type is an n-type.

9. An imaging system comprising:
   an imaging device according to claim 1; and
   a signal processing unit processing a signal given from the imaging device.

10. The imaging device according to claim 1, wherein the third semiconductor region forms a potential barrier against the charge generated in the photoelectric conversion unit.

11. The imaging device according to claim 1, wherein the third semiconductor region is provided to surround the photoelectric conversion unit in a planar view.

12. The imaging device according to claim 1, wherein the counter doped region is provided over a region deeper than the second semiconductor region from a surface of a semiconductor substrate.

13. The imaging device according to claim 1, wherein the counter doped region serves to compensate carriers based on an impurity of the first conductivity type implanted in a vicinity of a surface of a semiconductor substrate when forming the third semiconductor region.

14. The imaging device according to claim 1, wherein the third semiconductor region is configured by a plurality of semiconductor regions disposed at different depths, and has an impurity concentration of at least $1\times10^{17}$ cm$^{-3}$.

* * * * *